US010705512B2

(12) United States Patent
Scholzen et al.

(10) Patent No.: US 10,705,512 B2
(45) Date of Patent: Jul. 7, 2020

(54) METHOD FOR COMPUTER-ASSISTED SELECTION OF MACHINE COMPONENTS

(71) Applicant: Walther Flender GmbH, Dusseldorf (DE)

(72) Inventors: Andreas Scholzen, Moers (DE); Simon-Martin Schmidt, Dusseldorf (DE)

(73) Assignee: Walther Flender GmbH, Duesseldorf (DE)

( * ) Notice: Subject to any disclaimer, the term of this patent is extended or adjusted under 35 U.S.C. 154(b) by 155 days.

(21) Appl. No.: 15/572,040

(22) PCT Filed: May 6, 2016

(86) PCT No.: PCT/EP2016/060186
§ 371 (c)(1),
(2) Date: Nov. 6, 2017

(87) PCT Pub. No.: WO2016/177882
PCT Pub. Date: Nov. 10, 2016

(65) Prior Publication Data
US 2018/0143620 A1 May 24, 2018

(30) Foreign Application Priority Data
May 7, 2015 (DE) .................. 10 2015 107 176

(51) Int. Cl.
*G05B 19/418* (2006.01)
*G06Q 10/08* (2012.01)
(Continued)

(52) U.S. Cl.
CPC ... *G05B 19/4187* (2013.01); *G05B 19/41885* (2013.01); *G06F 30/17* (2020.01); *G06F 30/20* (2020.01); *G06Q 10/0875* (2013.01)

(58) Field of Classification Search
CPC .......... G05B 19/4187; G05B 19/41885; G06F 17/5009; G06F 17/5086; G06Q 10/0875
See application file for complete search history.

(56) References Cited

U.S. PATENT DOCUMENTS 5,353,381 A * 10/1994 Hamilton ............ G06F 11/2257
706/52
5,402,877 A * 4/1995 Thiele .................... B65G 19/10
198/731

(Continued)

FOREIGN PATENT DOCUMENTS

AU   2009203049 A1   2/2010
DE       4444263 C1   5/1996
(Continued)

*Primary Examiner* — Thomas C Lee
*Assistant Examiner* — Michael Tang
(74) *Attorney, Agent, or Firm* — The Webb Law Firm

(57) ABSTRACT

The objective of the invention is the computer-assisted selection of the optimal machine component for a use. In the selection, empirical values are collected to create a continuously improving system. To achieve this, the inventive method includes determining properties of the machine component and their corresponding influence quantities, possible uses for the machine component, and the influence quantities to be considered in the use-specific selection and design of the machine component. The method also includes receiving statements relating to the influence quantities and determining, influence quantity interactions. The method further includes formulating the influence quantities, feeding the use and associated influence quantities as inputs into a selection algorithm to select the machine component that is optimally suitable for the use, and supplying the selected machine component.

12 Claims, 4 Drawing Sheets

(51) Int. Cl.
     *G06F 30/17*           (2020.01)
     *G06F 30/20*           (2020.01)

(56) References Cited

U.S. PATENT DOCUMENTS

| | | |
|---|---|---|
| 5,843,258 A | 12/1998 | Murakami |
| 6,264,577 B1 | 7/2001 | Hutchins |
| 2001/0025469 A1* | 10/2001 | Gordon ................ G09F 3/00 53/445 |
| 2004/0053234 A1* | 3/2004 | Winther ............. C12N 9/0071 435/134 |
| 2007/0174138 A1* | 7/2007 | Lee ..................... G06Q 30/02 705/26.7 |
| 2009/0125270 A1* | 5/2009 | O'Shea ................ G06F 11/263 702/108 |
| 2009/0138117 A1* | 5/2009 | Bagwell ........... G05B 19/41865 700/110 |
| 2012/0323371 A1* | 12/2012 | Ballhausen .............. F16G 1/28 700/275 |
| 2014/0204828 A1* | 7/2014 | Connors .............. H04W 48/10 370/312 |
| 2016/0321606 A1* | 11/2016 | Kapil ................. G06Q 10/0875 |

FOREIGN PATENT DOCUMENTS

| | | |
|---|---|---|
| DE | 102010002551 A1 | 9/2011 |
| DE | 202016008121 U1 | 3/2017 |
| JP | 2002245093 A | 8/2002 |
| JP | 2009007078 A | 1/2009 |

\* cited by examiner

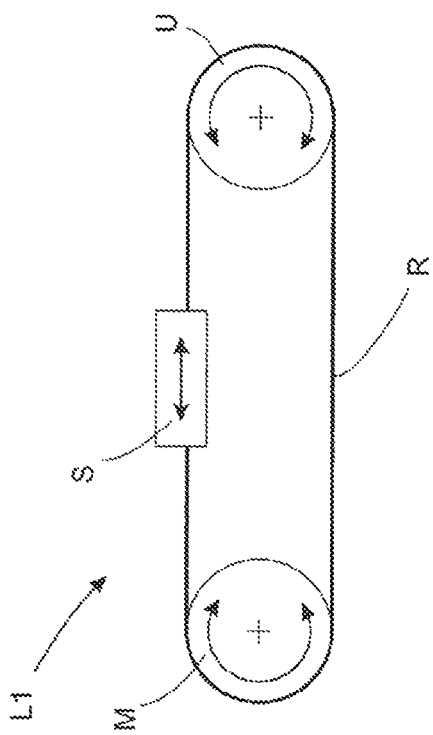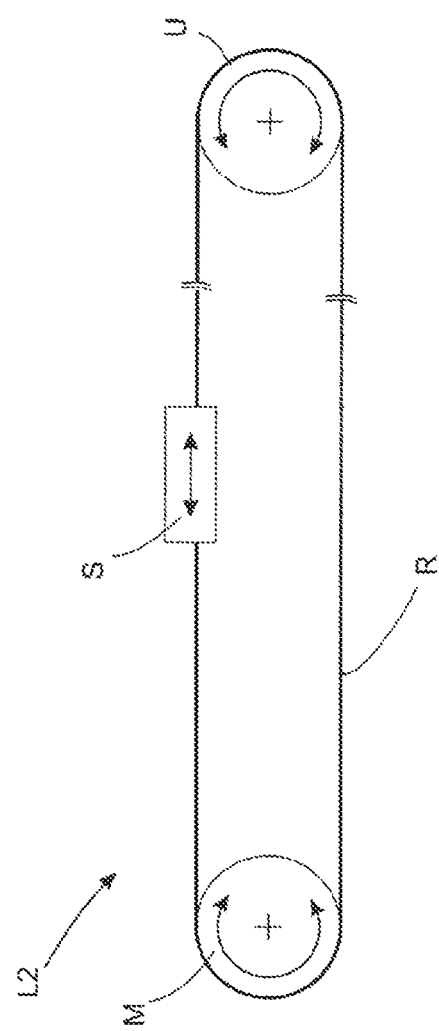
Fig. 3A
Fig. 3B

METHOD FOR COMPUTER-ASSISTED SELECTION OF MACHINE COMPONENTS

CROSS-REFERENCE TO RELATED APPLICATIONS

This application is the United States national phase of International Application No. PCT/EP2016/060186 filed May 6, 2016, and claims priority to German Patent Application No. 10 2015 107 176.2 filed May 7, 2015, the disclosures of which are hereby incorporated in their entirety by reference.

BACKGROUND OF THE INVENTION

The invention relates to a method by which, in a computer-assisted manner, machine components can be determined that are particularly suitable for a specified use.

"Machine components" are understood below to mean individual machine elements or groups of interacting machine elements that are combined to form specific aggregates. Each machine element considered is a very small technical functional unit that is suitable for fulfilling the technically functional requirements arising from each technical use considered. The term "machine component" accordingly also encompasses the parts, raw materials or process parameters applied in the manufacture of machine components or their machine elements since the properties and functions of the components and elements considered here are always characterised by the manner in which they are manufactured and the materials and methods used for this.

Currently, machine components are generally designed according to standardised methods with respect to the respective use. This approach is simple, proven, and safe because it secures individual differences in the uses through generalised "safety factors".

This selection and design system is described in more detail, for example, in "Maschinenelemente 2, Prof. Schlecht", Addison-Wesley Verlag; 2nd edition (1 Nov. 2009), ISBN-13: 978-3827371461, or "Maschinenelemente, Roloff/Matek" Springer Vieweg; 21st edition, fully revised 2013 edition (9 Aug. 2013), ISBN-13: 978-3658023263.

A typical example of machine components that can be selected in the manner considered and newly presented here is belts for belt drives. The selection of such belts is usually made in accordance with the VDI guideline 2758 "Riemengetriebe" of June 1993.

The conventional procedure for the use-specific selection of such machine elements from machine elements supplied as in a catalogue, in particular manufactured according to a specific manufacturer specification, can be summarised as follows (see also enclosed FIG. 2).

(a) The conditions set by the intended use and to be considered in the selection of the machine element are ascertained. These conditions include, for example, the static and dynamic loads to which the machine element will be subject during operation, as well as external conditions such as ambient atmosphere, temperatures, friction pairs, machine concept, etc. under which the machine element is to be used.

(b) Taking into account the machine concept, the engineer specifies a certain type of machine element.

(c) c.1 For the machine element type specified in (b), the performance values to be generated by this machine element type are calculated based on the conditions to be considered (a).

c.2 The calculated performance values are assigned safety margins in order to secure inaccuracies in the performance value calculation (b) or unforeseeable uncertainties occurring in practical use.

(d) On the basis of the performance values assigned safety margins, the machine element suitable for the intended use is selected from the machine elements supplied as in a catalogue.

Work steps (c) and (d) are usually depicted by tables or diagrams, or alternatively also by suitable software by means of which, based on the conditions (a) to be considered and in accordance with the decision taken in step b), the performance values to be generated in each case by the relevant machine element can be determined.

This design methodology, which is appropriate for practice but based on comparatively rough estimates, has the following limitations and disadvantages:

A preliminary specification of a particular machine element type is made.

In the further design and selection of the suitable machine element, the view is accordingly restricted to this one machine element type. Alternative machine elements that would possibly better solve the particular drive task within the framework of the predetermined machine concept are no longer taken into account in the further consideration subsequent to the preliminary specification.

The expected service life of the particular machine element cannot be taken into account in the selection and design, since the selection is secured by such high safety factors that the theoretically achievable service life of the machine element is much higher than the service life required or desired in practice.

In general, the machine element is more precisely determined and designed depending on fewer influence quantities. Consideration of a plurality of different but mutually dependent or influencing selection criteria is generally not possible due to the associated computing time.

The concrete design of the selected machine element is generally performed without consideration for the influence quantities related to the use. At best, such influence quantities are included in a roughly generalised manner.

The design is always carried out with very high safety coefficients in order to cover, with sufficient certainty, influence quantities that are unknown or not considered in detail.

The overdimensioning occurring as a result of the generalisation and safeguarding by means of safety margins leads to an unnecessary increase in the price of the particular machine element.

The capabilities of the machine elements are not used optimally. Due to the generalisation and safeguarding by means of safety margins, solutions that could be used with great success in practice are not feasible.

With regard to a use in which drive forces are to be transmitted to a part to be moved, this means that the engineer first specifies, for example, "belts" as their chosen traction mechanism. As a result, in their further considerations, they no longer commit to alternative traction mechanisms or drives that would possibly better solve the driving task.

The design of endless toothed belts is then carried out based on performance values that are stated in catalogues and that the belt manufacturers publish in general terms, that is, not use-specifically. The details supplied by various manufacturers relating to the drive belts they offer are not comparable because it is not clear on which basis the details have been determined. In particular, it is not known on which service life basis the values have been determined. Detailed guidelines or standards on how comparable performance values can be determined do not currently exist. Instead, the manufacturers of drive belts define their own calculation and design methods. As a result, the properties and selection criteria indicated by the different manufacturers are not comparable, or at most can only be compared with substantial effort and considerable uncertainty. Thus, products with seemingly similar property profiles often prove not to be mutually interchangeable because the stated properties have been determined in different ways.

A rough guideline for the calculation of the requirements that drive belts must fulfil is given in the guideline VDI 2758. Section 3 states: "The belt drive must on the one hand work safely under the specified requirements or operating conditions (rotational speeds, torques, space requirements, overloads, shaft displacements, temperatures and other environmental influences) over a reasonable period of time and should on the other hand minimise the environmental impact (noise, vibrations, etc.)." The question as to how these requirements can be fulfilled whilst ensuring optimal utilisation of the performance potential provided by the drive belt remains open.

SUMMARY OF THE INVENTION

The invention presented here aims to specify a method that allows the systematic and targeted selection of the machine component that is most suitable for a particular use; empirical values should be included in this selection in order to thus create a continuously self-improving system.

The invention has achieved this object by means of the method stated in claim 1.

Advantageous embodiments of the invention are given in the dependent claims and, like the general concept of the invention, are explained in detail below.

BRIEF DESCRIPTION OF THE DRAWINGS

The method proposed by the invention is illustrated in FIG. 1 in the form of a diagram.

FIGS. 3A-3B depict schematic diagrams of linear drive units to which the selection criterion of the invention may be applied.

DESCRIPTION OF THE INVENTION

Figure 1:
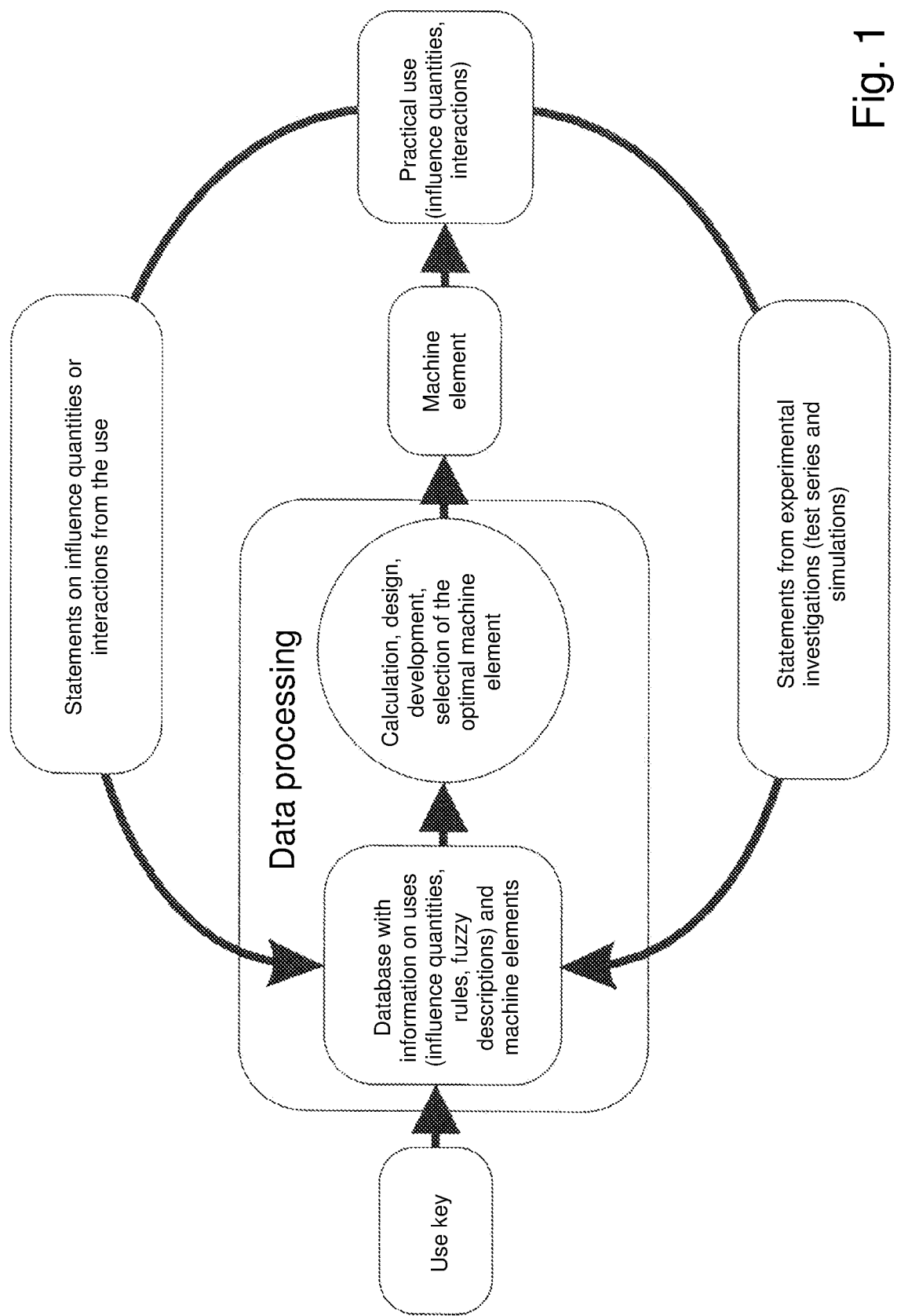
Figure 2:
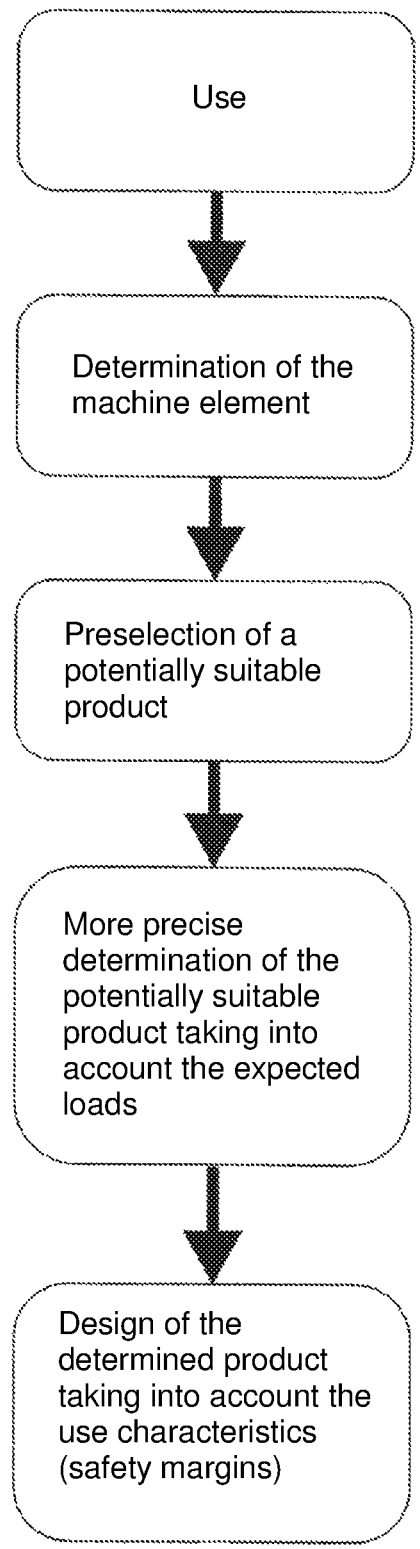
FIG. 2 depicts a flow diagram of a conventional procedure for the use-specific selection of machine elements.

Accordingly, a method according to the invention for computer-assisted selection of a machine component intended for a specific use comprises at least the following work steps:

a) Properties of a respective machine component considered and influence quantities determining these properties are ascertained.

b) Possible uses for the respective machine component considered are determined.

c) For the respective machine component considered, the influence quantities to be considered in the use-specific selection and design of the machine component, to which it is subject during its use, are ascertained.

d) In practical use or through systematic experimental investigations of the machine components, statements relating to the influence quantities are collected and information on the interactions of the influence quantities is ascertained from the collected statements.

e) The information ascertained in work step d) relating to the interactions is fed as machine-readable data into a database.

f) The influence quantities arising during the intended use are formulated for the selection of the machine component suitable for the respective intended use.

g) The use and the associated influence quantities are fed as input quantities into a selection algorithm running on a computer that, taking into account the input quantities, uses the information stored in the database to select the machine component that is optimally suitable for the respective use.

h) The machine component selected in work step g) is supplied for the intended use.

In the method according to the invention, properties and the influence quantities determining these properties are thus ascertained in the first work step for each machine component considered.

Then, for the particular machine component considered, the possible uses are determined and it is ascertained to which influence quantities the machine component is subject during the particular use and which influence quantities are correspondingly to be considered in the use-specific selection and design of the machine component.

In a subsequent work step, the interactions of the influence quantities are ascertained from statements relating to the influence quantities that have been obtained during practical use of the machine component considered, or from statements related to the influence quantities and obtained by systematic experimental investigations. Should it transpire that influence quantities exist that have not yet been identified as such, then these newly recognised influence quantities can be added to the group of influence quantities to be considered and interacting with others.

If the product-specific or use-specific interactions can be described using a formula with a rule, this rule is formulated. Alternatively or additionally, the interactions can also be recorded in the form of fuzzy descriptions ("fuzzy logic", artificial neural networks, other methods of artificial intelligence) of the connections.

The information ascertained in the preceding work steps relating to the interactions (e.g. influence quantities, rules, fuzzy descriptions of interactions) are fed as machine-readable data into a database. This database can, in a manner known per se, comprise one, two or more individual databases, each containing machine-readable data relating to specific uses.

Items of information ascertained on mutually influencing requirements and influence quantities are optionally linked to one another in the database in such a way that changes to one item of information have direct effects on the other item(s) of information linked to it. In the database, a network of items of information that are interrelated and linked to certain machine components is generated which is related to a variety of different uses.

The influence quantities arising during the relevant use are formulated for the selection of the machine component that is suitable for the particular use. The use and the associated influence quantities are fed as input quantities into a selection algorithm running on a computer. The selection algorithm then selects, taking into account the input quantities and using the information stored in the database, the machine component that is optimally suitable for the particular use.

It is essential for the invention that the machine element that is optimally suitable for the particular use is accurately determined in an automated process based on empirically ascertained or theoretically formulated information stored in a database, on the basis of the intended use. The information used for this purpose and stored in the database describes the relationships existing between the particular use, the influence quantities applicable to it and their interactions, and its quality and meaningfulness can be continuously improved in the sense of a self-learning system by repeated inputting of newly acquired information.

For continuous improvement of the database created by work steps a)-f) for the selection step (work step g)), the following work steps can be additionally performed:

i) The machine component selected in work step g) is equipped with an identification means that enables individual monitoring and recording of the machine component.

j) The selected machine component is identified and monitored in its practical use with the aid of the identification means, wherein the monitoring provides a statement regarding a characteristic value representing one of the influence quantities considered.

k) The statements collected in work step j) are fed as influence quantities into the process starting with work step c).

To monitor and identify the machine component selected, the identification means can not only carry information that clearly identifies the particular machine component but also information on the condition of the machine component in order to, for example, easily assign the measured values obtained by the monitoring to a particular property combination of the considered machine component.

In the simplest case, the monitoring provides a statement regarding a single characteristic value, such as, for example, the duration that elapses between the start of the use and a replacement that becomes necessary due to wear. In addition, however, the monitoring can also provide statements on a set of two or more characteristic values, such as, for example, the external influences (temperature, atmosphere) to which the machine component has been subject in use. The identification means can also even be equipped in such a way that it provides statements regarding the internal state and the loads of the machine element during operation. It is, of course, also possible to use other measuring methods that are known per se in order to detect the forces prevailing in the machine element during use, its changes in length, temperature development and the like (in this regard, for the example of a belt drive see U.S. Pat. No. 6,264,577 B1, DE 10 201 0 002 551A1, JP 2009-007078 A, DE 44 44 263 C1, U.S. Pat. No. 5,843,258 A, AU 2009203049 A1).

An optimised self-learning, constantly improving self-learning selection system that illustrates the practical reality more and more realistically is created with work steps i) to k), which are optionally performed in addition. Of course, not every machine component selected according to the invention must undergo the additional work steps i) to k), but it may be sufficient if at least one machine component, optimally a representative number of machine components in the particular use, is monitored.

For the assignment of the influence quantities to specific uses of the machine components, a so-called "use key" can be defined that couples the use and assigned influence quantities in a standardised form. The machine processing of the selection process can be simplified by such a use key.

The system according to the invention can be designed so that, in the case of new uses for which there is not yet any directly assigned information in the database, it determines the closest use and makes a proposal for a machine element to be used on the basis of this closest use, for example by means of the influence quantities assigned to this new use and the interactions ascertained or formulated from the information stored in the database. In this way, an optimally suitable machine element can also be quickly determined in an iterative process for a new use without the need to perform complex, time-consuming tests for that purpose.

The advantages of the method according to the invention thus lie in a detailed, use-specific consideration and dimensioning of the design according to any criteria, an optimal utilisation of the product and material properties according to the customer requirements and optimal selection of machine elements (e.g. belt or chain), the target-oriented and use-specific design of the machine element and thus in the avoidance of overdimensioning, the associated optimisation of the efficiency, the reduction of losses and the resulting conservation of scarce resources, the transparency of the influence quantities in relation to each other, the possibility of selecting the particular machine element in accordance with a certain requirement, for example its service life, the avoidance of uncontrolled failures that can be caused in the prior art by the selection of machine elements that prove adequate according to the selection criteria previously considered but in practice prove unsuitable, or by unrecognised interactions of influence quantities, the continuous improvement of the prediction of more use-specific questions, and the targeted, economical product development for special problems, wherein the specific advantage of the procedure according to the invention here is that not only can individual parts or assemblies be taken into account as machine components in the selection, but the result of the approach according to the invention, when determining the optimised component for the particular use, can also be proposals for the selection of certain parts, materials or method parameters by means of which a machine element or an assembly ("aggregate") formed from a plurality of interacting machine elements can be produced that is optimally adapted to the requirements arising from the intended use.

Use-related influence quantities can be mechanical loads (rotational speed, torque, pretensioning forces, drive geometry, friction pairing, load change, load cycles, velocities, accelerations, tensile or compressive stresses, other dynamic or static loads; in particular, for the "belt drive" example, the transmission, positioning accuracy, balancing quality, pulley size, number of engagement teeth, back deflection, bending cycle frequency and edge change can also be important);

environmental conditions (atmosphere in which the use takes place, ambient humidity and temperature, contamination, material combination, pressure), properties of the material of which the machine component is made (material behaviour during heating, under load, with load changes, with friction; in particular, for the "belt drive" example, the age of the belt as well as the properties of the materials used for the production, such as cord, elastomers (for example rubber/PU, etc.), fabrics, adhesion promoters, and the production conditions and parameters selected during production, such as pressures, temperature, time, can be taken into account), geometric shape and quality of the machine component (in the "belt drive" example these are, for example, the tooth shape, gap clearance, shape of the pulleys, condition of the pulley surfaces, the concentricity and alignment of the pulleys, surface roughness, tooth shape, gap clearance, balancing quality).

In particular, the invention is concerned with the use-specific selection and design of means for transmitting kinetic energy to a part to be moved, wherein these means especially are belts or chains and the components directly interacting with these drive means. These include:

toothed belts
V-belts
flat belts
belt drives in general, in particular toothed belt drives
pulleys
multi-V-belts
pulleys/pulley profiles collectively
transmissions
motors
couplings in general, especially friction couplings
clamping sets/shaft-hub connections
freewheels
rolling bearings
plain bearings
chains
seals
brakes
gear wheels
springs
dampers
hoses If a drive aggregate is considered a machine component that is formed of the elements "drive pulley", via which a drive force is introduced,
"endless toothed belt", via which a load coupled to it is moved, and
"deflection pulley", around which the toothed belt is deflected, then the following influence quantities and interactions result, for example: Table 1

| Element | Influence quantity/interaction |
| --- | --- |
| Belt | Material properties of the cord |
| Belt | Material properties of the base material surrounding the cord (for example polyurethane/neoprene/rubber) |
| Belt | Type of insert (fabric) |
| Belt | Material properties of the adhesion promoter |
| Pulleys | Surface condition/surface treatment/surface coating (for example burnishing/PTFE material (polytetrafluorethylene) |
| Pulleys | Concentricity |
| Pulleys | Drive alignment/deflection |
| Pulleys | Surface roughness |
| Pulleys | Type and parameters of the - in particular machining - process, for example cutter feed |

-continued

| Element | Influence quantity/interaction |
| --- | --- |
| Belt | Age |
| Belt | Belt production process parameters (pressure/temperature/time) |
| Belt/pulley | Tooth shape |
| Belt/pulley | Gap clearance |

Characteristic values for the loads that can play a role in the selection according to the invention and are recorded as such and stored as information in the database are, for example, power
rotational speed,
torque,
pretensioning force,
drive geometry,
pulley size (drive/deflection),
number of engagement teeth,
back deflection,
load change,
load cycles,
bending cycle frequency,
edge change.

The ambient conditions that can be taken into account as influence quantities in the selection according to the invention, include, for example chemical composition of the ambient atmosphere, such as, for example, the presence of ozone in the ambient atmosphere,
temperature of the ambient atmosphere,
humidity of the surrounding atmosphere,
corrosiveness of the surrounding atmosphere—in particular salt content,
particle loading of the ambient atmosphere—in particular contamination as a result of metal abrasion or other abrasion,
pressure—in particular vacuum or high overpressure,
temperature fluctuations.

Possible previous damage or other mechanical inadequacies of the machine element, in particular of the belt, can also be considered in the selection.

With the invention, it is possible to perform a customer-oriented, simple determination of the most suitable machine element, especially for individual industrial uses with a small number of units.

Two exemplary embodiments that are typical for the invention are described below:

Belt drives are typically used in linear axis drives.

In the simplest case, as shown in FIGS. 3a, 3b, a linear drive unit L1, L2 consists of a drive pulley M, a deflection pulley U, a movable carriage S and the belt R, to which the carriage S is coupled. The carriage S is moved back and forth by means of the belt R between its two end positions at the end of the axis.

In the prior art, the selection criterion for the belt R from catalogue products is usually the forces to be absorbed by the belt R. For both units L1, L2 sketched in FIGS. 3a, 3b, the same performance requirements for the belt R to be used would thus result given the same carriage mass and carriage acceleration. In practice, belts R are therefore used in the units L1, L2 that have identical performance characteristics. Nevertheless, they have substantially different service lives.

A specification that is common in practice for the service life of a belt is the so-called "kilometrage", that is the total distance the belt travels throughout its entire service time. Accordingly, with the same number of load cycles, the kilometrage in the first linear unit L1 with its more closely interconnected drive and deflection pulleys M, U is lower than in the linear unit L2, in which the drive and deflection pulleys M, U are at a greater distance from each other.

In reality, such a drive will fail in one of the two end positions due to wear of the belt teeth. Only in the end positions are the belt teeth stressed by acceleration and braking forces. The teeth on the rest of the movement path are almost unstressed and are rolled over by the belt pulley without a significant force transfer taking place here. Given the same load, the service life of the teeth in the end positions is also the same in terms of the number of achievable load changes. However, the much longer linear drive unit L2 shown in FIG. 3b will achieve approximately twice the kilometrage in terms of the movement path with the same number of load changes. If the drive and deflection pulleys M, U are spaced twice as far apart in the linear unit L2 as in the linear unit L1, and the velocity at which the carriage S is moved and the load formed by the carriages S are the same in both systems, it can be assumed that the service life of the belt R of the linear unit L2 measured in hours is significantly greater than the service life of the belt R of the linear unit L1 because the kilometrage that the belt R of the linear unit L2 has travelled is twice the kilometrage of the belt R of the linear unit L1.

Figure 4:
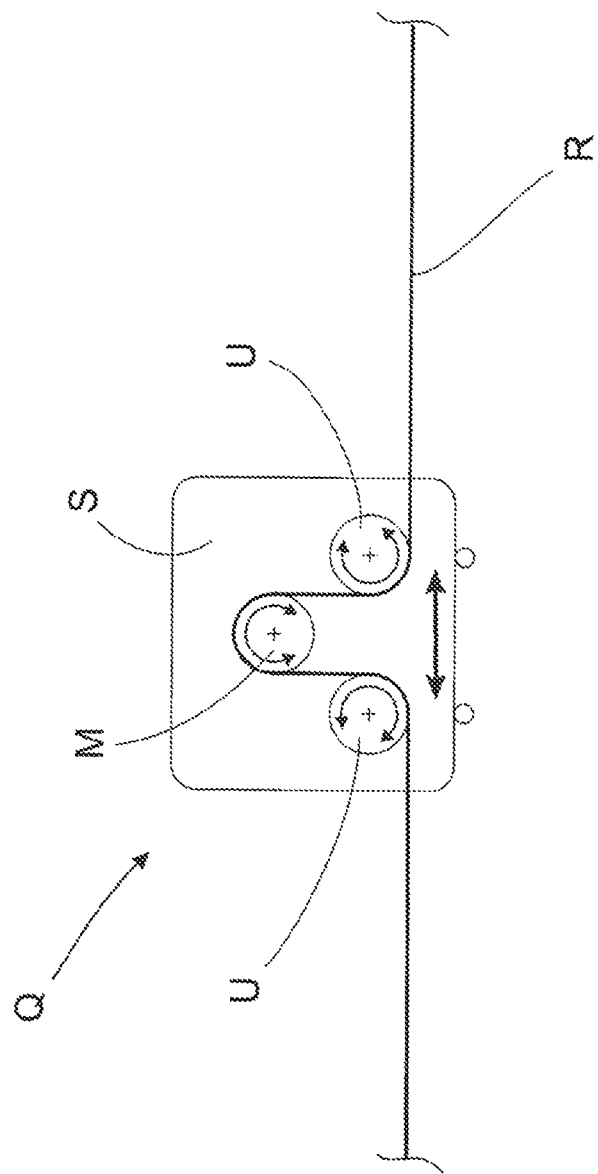
FIG. 4 depicts a schematic diagram of an "omega drive" to which the selection criterion of the invention may be applied.

A further example is a so-called "omega drive (Ω drive)" Q shown in FIG. 4.

The drive pulley M of the motor and the deflection pulley U are fastened here to a movable carriage S. According to the current catalogue value, the design of the required belts R when friction is neglected is identical if the product of mass and acceleration is equal (force F=mass m×acceleration a). A very heavy carriage S with low acceleration can thus lead to the same force in the belt R as a very light carriage S that experiences very high accelerations. However, in practice a highly dynamic drive with high numbers of load changes is more likely to fail due to tension member fatigue or wear, whereas a slow-moving drive that moves high masses is more likely to fail due to tooth shearing.

Added to this are ambient influences. Toothed belts made of neoprene are approved, for example, up to 100° C. Neoprene becomes softer with increasing temperatures, the tooth deforms faster under load and the belt jumps more easily. The catalogue makes no difference here. Either the confidence coefficients are so high at 20° C. that the values according to the catalogue are reached even at temperatures of 100° C., or there is a risk at higher temperatures.

The method according to the invention makes provision for determining the essential influence quantities on the basis of measurement series for as many different load cases as possible so as to enable an exact belt dimensioning tailored to the particular use. The achievable operational performance for drives according to FIGS. 3A and 3B are then determined based on the attainable number of load changes and using the belt length, and expressed as a kilometrage.

An Ω drive according to FIG. 4 does not require any additional safety for operation at 100° C. if it is operated only in a factory hall in which people work and no additional waste heat is generated. Under such conditions, the ambient temperatures reach a maximum of 40° C.

In the case of closed toothed belt drives the conditions are similar. If the drive power is the same, then, for example, the calculation of a drive for a fan that runs permanently in one direction of rotation is performed analogously to that of a drive for the feed axis of a machine tool that permanently accelerates with high acceleration values from the idle state to nominal speed and constantly changes direction of rotation. Pulley quality, toothing quality and so on are not considered in the calculation or are at best considered via standard load factors. With the method according to the invention, the entire drive can be incorporated into the belt dimensioning.

In the example of a fan drive, the fan always rotates in one direction only. For noise reduction, the pulley gap can be increased, which has no impact on the service life of the belts here. The feed drive requires a small clearance between the belt and the pulley because high accuracies of the position are required. In addition, the constant change of direction would always result in a sudden edge change between the belt teeth and pulley teeth. Little gap clearance results in higher friction, the risk of higher wear and reduced service life, or conversely a wider belt is required to obtain the desired service life until the next maintenance interval. In this case, the achievable service life is dependent on the interaction between the drive task, toothed belt and toothed belt pulley, in certain circumstances also taking into account the ambient conditions. Standardised catalogue specifications cannot provide a solution tailored to the drive case here. Since, in spite of all this, failures are seldom known in practice, this is evidence that the drives are generally dimensioned far too large to cover all these unknown influencing factors through the built-in safety margins.

In the course of the method according to the invention, the known uses are recorded in which, for example, the belts considered here by way of example are used. To this end, customer data, uses and used products, production conditions, operating conditions and so on are recorded in detail in a use key. On suitable test stands, the use scenario typical for the particular use is then simulated and, for this specific use, service life tests, for example, are carried out. The findings obtained from the practical customer experiences or using the test results become part of the pool of interrelated items of information stored in the database. If the customer specifies that a certain belt service life is desired during its use, a belt is selected on the basis of the stored information that, taking into account the other conditions applicable for the intended use, is precisely dimensioned so that it safely attains the specified service life but cannot be used further. That is, the customer does not receive a drive that can transmit its motor power for an indefinite period of time, but a drive that reliably fulfils the drive task for the criteria desired by the customer, for example desired service life or other criteria such as, for example, environmental influences, costs, etc. Spare part requirements (and thus the spare parts business) are calculable and can be adapted to the maintenance and service intervals accordingly.

A belt drive and a method that enables it to determine the loads to which the essential components "pulley" and "belt" are subject in a belt drive are the subject-matter of the German patent application 10 2015 107 177.0 entitled "Riemenantrieb and Verfahren zum Überwachen eines solchen Riemenantriebs" (Engl. "Belt drive and method for monitoring such a belt drive"), which the applicant of the present application filed with the German Patent and Trademark Office on the same day as the present application, and the content of which is included in the disclosure of the present application.

The success of the selection according to the invention is clearly illustrated by the following example:

A use in which drive and deflection pulleys with a small diameter are operated at a high rotational speed and in which a small centre distance and a correspondingly high bending cycle frequency of the tension members are combined leads in conventional procedures to the result that this group of requirements cannot be fulfilled with a standard belt.

A belt should be determined for a use in which a group of requirements has arisen and for which a suitable belt that is pre-assembled as a catalogue product—no special production—could not be determined according to the conventional procedure.

However, taking into account the additional influence quantity "heating of the belt as a result of the heating that occurs due to the flexing required during the belt circulation", a belt could be determined in the manner according to the invention that consists of a thinner and more flexible tensile member as well as a softer rubber mixture given a reduced back thickness. In the selection made according to the invention, experience also played an essential role in the fact that the thinner tensile member is better able to withstand the bending cycle load and that, as a result of the softer rubber mixture, the lower belt thickness and the more flexible tensile member, lower flexing leads to reduced heating of the belt in use.

The selection, which is made according to the invention taking into account new influence quantities and experience gained from practical experience and, where appropriate, experimentally confirmed interactions, thus resulted in a toothed belt that reliably fulfils the requirements placed on its life expectancy even though it would not have been found or would have been sorted out of the range of possible belts due to the safety margins provided for in the conventional procedure. Findings gained in the practical use of the belts selected accordingly are incorporated into the database constructed according to the invention for the purpose of refining the selection criteria so that an even more suitable toothed belt is found in a targeted manner during the next search for a belt that is intended for a use subject to the same requirements.

In order to detect its function and the load to which the toothed belt selected in the manner described above is subject in practical use, some of these belts can be systematically monitored on a test stand that reproduces the requirements and conditions occurring in reality. The same could also be implemented with the machines equipped with the toothed belts selected according to the invention.

On the test stand as well as in the relevant machines equipped accordingly, belts are then used to which an identification means has been attached in the course of their manufacture or assembly. This identification means can be an RFID chip that is inserted into the material of the belt. The RFID chip can carry information regarding the belt and be equipped in such a way that it transmits this information to a sensor arranged at a suitable location on the test stand or the machine and detects the information. Likewise, at least one of the pulleys of the drive to which the belt selected according to the invention is assigned can be equipped with an identification means. Its information can also be detected by a sensor.

The detected information is then transmitted to an evaluation unit. By comparing the information provided by the belt and the pulley, new information relating to the drive's synchronous running, service time, wear, concentricity and so on can be obtained that are used to improve the meaningfulness of the information contained in the database constructed according to the invention.

It is, of course, also possible to use other identification means than the RFID chips mentioned here for the identification of the belt and the pulley. It would be conceivable, for example, to design the identification means so that, for example, they actively detect the temperature development, deformation or dynamic forces to which the belt is subject in use, and deliver them to the sensor. Such actively obtained data in turn contribute to the improvement of the result of a selection made according to the invention.

Below, examples are presented in which it is in practice possible to determine, with the procedure according to the invention, machine components that are optimally suitable for the particular use.

PRACTICAL EXAMPLE 1

Numerous rotary drives are contained in beverage filling systems that are often designed as belt drives.

In filling operations, it repeatedly occurs that a beverage to be filled is spilled and the moving parts of the belt drives are wetted with the beverage.

At the same time, beverage filling systems are subject to strict hygiene regulations and must be cleaned regularly. Comparatively aggressive cleaning chemicals are used for this purpose.

Owing to the frequent cleaning processes and the arrangement of the drives mostly below the systems, the belt drives are difficult to access. This often leads to the cleaning chemicals sticking to them and drying out.

Assuming that the beverage to be filled does not have a major influence on the service life of the particular drive belt, in the process according to the invention, the forces to be transmitted and the chemical stress caused by the cleaning chemicals interacting with the material to be regarded as a "property" in the sense of the invention were initially taken into account as major influence quantities for the use of a "beverage filling system", the "drive belt" and "belt pulley" components of the belt drive being made of said material.

In the practical use of the drive belts designed in this manner, it was found that, in the filling of certain beverages, massive premature damage to the drive belts occurred despite the required resistance to the cleaning chemicals, whereas the belts easily attained the intended service life when other beverages were filled.

The result of a comparison of the operating conditions detected according to the invention under which the relevant belts were used was that the type of beverage to be filled and its interaction with the cleaning chemicals or the material of the machine components "drive belts" and "drive pulleys" used in the belt drive must be taken into account as a further influence quantity for the use case "beverage filling system".

By incorporating the information identified through this additional interaction into the selection process according to the invention, belts have been proposed as a result for filling systems where beverages with high sugar content are filled. These belts are made of a material combination that is insensitive to the liquid mixture that forms from spilled sugar-containing beverage residues, water and cleaning chemicals and that aggressively attacks certain belt materials, whereas conventionally designed drive belts can be used in beverage systems where beverages with lower sugar contents are filled.

PRACTICAL EXAMPLE 2

Polyurethane toothed belts ("PU belts") are generally highly resistant to water and moisture. In dry air, temperatures of up to +50° C., in some cases even +80° C., are not a problem for the PU belts. Similarly, there is no problem when PU belts are operated at high humidity and room temperature.

However, if a combination of high humidity and a high temperature is present, this leads to the destruction of the PU material of the belts.

An essential property for the process according to the invention of the selection of a suitable belt for the use "drive of an aggregate" is therefore also the base material of which the particular belt is made, as well the ambient temperature and ambient humidity expected as "influence quantities" and the effects on the material of the belt resulting as an "interaction" depending on the absolute value of the temperature and humidity.

PRACTICAL EXAMPLE 3

In the use "drive of a machine tool", the material of the drive belts available for selection is taken into account as a "property" and the temperature conditions in addition to the expected mechanical loads, the lubricants used in the machine tool and their interaction with the material of which the belts are made are taken into account as influence quantities for the selection process.

PRACTICAL EXAMPLE 4

For cleaning purposes, so-called demineralised water is often used from which all minerals have been removed. If toothed belts, seals and other machine components are used in an environment with corresponding loads, the materials of the machine components are in turn taken into account as "property" in the selection according to the invention and their interaction with the demineralised water as "interaction".

The information that is decisive here for the selection according to the invention and that is generally incorporated into the database provided according to the invention in relation to the interactions of the influence quantities involved is that, if the material of the machine components contains a plasticiser, there is a high tendency for the latter to travel into the water as a result of the osmotic gradient. Thus, for example, drive belts whose base material is an elastomer are prone to premature embrittlement when used in an environment where demineralised water is used.

PRACTICAL EXAMPLE 5

It is known that mould parts made of polyamide are prone to absorb water under certain ambient conditions, and that the water absorption can be accompanied by a change in the dimensions of the mould part.

If mould parts made of polyamide are to be used in drives in which tight fits of the interacting machine elements are required, changing ambient conditions can consequently lead to problems.

This information on the "interaction" of the "property" material =polyamide with the "influence quantities" temperature and ambient humidity is stored in the database provided according to the invention.

On the basis of the specification that the particular machine component is made of polyamide and a maximum dimensional accuracy is to be ensured, the selection according to the invention gives rise to the instruction to operate the mould part in an environment with a constant temperature and humidity.

PRACTICAL EXAMPLE 6

A further example demonstrating that the ambient conditions can be of decisive importance as influence quantities for the selection of the drive means is theatre lamps in which adjustable screens are used to focus the light beam. The adjustment is effected by means of electric motors that are connected to the screens via toothed belts.

Because of the fact that the interaction between the high temperature, UV and ozone stress prevailing in the environment of the lamps on the one hand and the base material ("property") of the toothed belts on the other hand is considered essential information in the selection according to the invention, the method according to the invention results in a drive belt for the use "theatre lamp" that, despite the adverse conditions, is not prone to the embrittlement that occurs under these conditions in belts whose base material is a conventional elastomer.

PRACTICAL EXAMPLE 7

In certain uses, a particularly quiet, noise-minimised running of a particular belt drive is desired.

"Noise emission" is thus the result of the interaction of certain properties and influence quantities that must also be taken into account in relation to the particular use when selecting the suitable machine component.

Appropriate tests can be used to perform a qualification of certain fabrics ("property") for a reduced noise emission, wherein certain material pairs ("interaction of properties"), certain operating conditions ("influence quantities") and certain geometries ("properties") of the cooperating machine elements additionally are systematically investigated in order to describe the interactions between the different materials in terms of noise emission. The information obtained through these experiments is stored in the database provided according to the invention and coupled with the information already existing there in relation to the particular use case.

PRACTICAL EXAMPLE 8

The choice of tension members (for example aramid, carbon fibre) can determine in certain use cases whether or not a belt is suitable for a deflection over the belt back, or up to which curvature radii this can take place. As the service time increases, small cracks develop in the deflection over the belt back due to the alternating bending in the very hard polyurethane, which expand as the number of bending cycles rises.

Aramid tensile members are very sensitive to the notch effect. Whereas this influence now leads to fractures in the aramid tensile member, the carbon tensile member tolerates this influence because the notch sensitivity is lower.

The effect is more pronounced the smaller the bending radii are and the higher the speed. This means that the aramid tensile member with back deflection can also lead to a sufficient service life at a low rotational speed and correspondingly large deflection. With the procedure according to the invention, a characteristic value can be determined from these interrelationship up to which the aramid tensile member could also be used in the case of back bending. Added to these are in turn influences on the tensile members that are caused by external influences, such as, for example, moisture (creep of the tensile member in the case of moisture).

A further influence that strengthens the effect is the special feature of aramid that it shortens under the effect of heat in the longitudinal direction of the fibres. If the belt becomes warm, it contracts or, if contraction is prevented by the pulleys, the belt tension increases. This also influences the effects of the cracks on the notch sensitivity of the tensile member. Accordingly, these special features are also taken into account in the selection system according to the invention as influence quantities (power, velocity or rotational speed, ambient moisture, back deflection and their diameter, temperature) and interactions that influence the design criterion "service life of the belt in the special use".

PRACTICAL EXAMPLE 9

In the case of drive belts used in automobiles, the type of rinsing of the tensile members influences the service life in special uses. Thus, not only does the selection of the traction member material have an influence on the service life of the drive belts, but even the individual design of an individual tensile cord.

Thus, belts with a higher number of tensile member cords have very good dynamic bending properties, while belts with a lower number of tensile member cords in a dynamic motor use with the start/stop changes, temperature influences and numerous bending cycles occurring there lead to premature failures. The differences cannot be ascertained solely by static tensile or elongation tests, but can only be systematically detected in field tests by empirical detection of belts appropriately equipped in accordance with the invention.

The results of such systematic tests are fed as properties or influence quantities into the database system provided according to the invention, and, together with the description of the interactions of these properties and influence quantities also stored in the database, form the criteria for the selection of the most suitable component with regard to the use.

PRACTICAL EXAMPLE 10

According to the manufacturers' specifications, certain toothed belts are approved for use within certain temperature ranges. However, it remains unclear under which other conditions the belts may be used within these temperature ranges.

Practice shows that it makes a difference whether a belt is operated at a rotational speed of 5000 revolutions per minute at ambient temperatures of 20° C. in a well-ventilated environment, or whether the belt is subject to an ambient temperature of 60° C. in a small closed gearbox. Belts operated at the high temperature in a tight space will not attain a satisfactory service life even if the manufacturer's guidelines have been adhered to.

Only by taking account of the ambient conditions in the selection of the suitable belt in accordance with the invention is it possible to determine a drive belt that reliably operates even at high temperatures and tight spaces.

REFERENCE NUMBERS

L1, L2 Linear drive units
M Drive pulley
R Belt
S Carriage
U Deflection pulley
Q Omega drive (FIG. 4)

The invention claimed is:

1. A method for computer-assisted selection of a machine component of a belt drive intended for a specific use, comprising the following work steps:
   a) determining properties of a respective machine component and influence quantities that determine the properties, wherein the influence quantities that determine the properties of the respective machine component are at least one of mechanical loads and environmental conditions;
   b) determining possible uses for the respective machine component;
   c) determining the influence quantities to be considered in use-specific selection and design of the respective machine component, to which the respective machine component is subject during its specific use, based on a closest use that is different than the specific use of the respective machine component;
   d) in practical use or through systematic experimental investigations of machine components, collecting statements relating to the influence quantities and determining information on interactions of the influence quantities with the properties of the respective machine component from the collected statements;
   e) feeding the information determined m work step d) relating to the interactions as machine-readable data into a database;
   f) formulating the influence quantities arising during intended use for the use-specific selection of the respective machine component suitable for the specific use, wherein the influence quantities arising during intended use are at least one of the mechanical loads and the environmental conditions;
   g) feeding the intended use and the influence quantities as input quantities into a selection algorithm running on a computer that, taking into account the input quantities, uses the information stored in the database to select at least one machine component that is optimally suitable for the specific use;
   h) equipping the at least one machine component selected in work step g), monitoring and recording of the machine component individually;
   i) supplying the at least one machine component selected in work step g) for the specific use;
   j) identifying and monitoring the at least one selected machine component in the specific use, wherein the monitoring provides a statement regarding a characteristic value representing one of the influence quantities considered; and
   k) feeding the statements collected in work step j) as the influence quantities back into the method starting with work step c).

2. The method according to claim 1, wherein, when in work step d) previously unidentified influence quantities are determined, the previously unidentified influence quantities are added to the influence quantities to be considered.

3. The method according to claim 1, wherein the database comprises one or more individual databases, each containing machine-readable data relating to specific uses.

4. The method according to claim 1, wherein in the database, mutually influencing requirements and the influence quantities are linked to one another in such a way that changes to one has direct effects on the other.

5. The method according to claim 1, wherein, a representative number of machine components is monitored during the specific use.

6. The method according to claim 1, wherein the identifying and monitoring the at least one selected machine component in the specific use comprises information that identifies the respective machine component and information regarding a condition of the respective machine component.

7. The method according to claim 1, further comprising recording, in work step j), a duration that elapses between start of the specific use and when a replacement becomes necessary due to wear.

8. The method according to claim 1, wherein the monitoring in work step j) comprises providing statements regarding a quantity of two or more characteristic values.

9. The method according to claim 1, wherein the monitoring provides statements regarding an internal state and stresses in the respective machine component during operation.

10. The method according to claim 1, wherein the interactions of the influence quantities with the properties of the respective machine component are recorded in the form of fuzzy descriptions or described by a formulaic rule.

11. The method according to claim 1, wherein the properties of the respective machine component comprise at least one of the following: properties of a material of which the respective machine component is made, properties of materials used for production of the respective machine component, production conditions and parameters selected during production of the respective machine component, or any combination thereof.

12. A system for computer-assisted selection of a machine component intended for a specific use, comprising a database and a processor for performing the method according to claim 1.

* * * * *

UNITED STATES PATENT AND TRADEMARK OFFICE
CERTIFICATE OF CORRECTION

PATENT NO. : 10,705,512 B2  
APPLICATION NO. : 15/572040  
DATED : July 7, 2020  
INVENTOR(S) : Andreas Scholzen et al.

Page 1 of 1

It is certified that error appears in the above-identified patent and that said Letters Patent is hereby corrected as shown below:

On the Title Page

Column 2, Line 11, Item (57) ABSTRACT, delete "determining," and insert -- determining --

In the Claims

Column 16, Line 26, Claim 1, delete "m" and insert -- in --

Signed and Sealed this  
Sixth Day of October, 2020

Andrei Iancu  
*Director of the United States Patent and Trademark Office*